United States Patent
Goodman

(10) Patent No.: US 6,634,882 B2
(45) Date of Patent: Oct. 21, 2003

(54) SUSCEPTOR POCKET PROFILE TO IMPROVE PROCESS PERFORMANCE

(75) Inventor: Matthew G. Goodman, Chandler, AZ (US)

(73) Assignee: ASM America, Inc., Phoenix, AZ (US)

(*) Notice: Subject to any disclaimer, the term of this patent is extended or adjusted under 35 U.S.C. 154(b) by 113 days.

(21) Appl. No.: 09/747,173

(22) Filed: Dec. 22, 2000

(65) Prior Publication Data

US 2003/0049580 A1 Mar. 13, 2003

(51) Int. Cl.⁷ ................................................. F27D 5/00
(52) U.S. Cl. ...................... 432/253; 432/261; 211/41.18
(58) Field of Search ................................ 432/253, 258, 432/259, 261; 211/41.18; 269/55; 118/500

(56) References Cited

U.S. PATENT DOCUMENTS

| | | | |
|---|---|---|---|
| 4,560,420 A | 12/1985 | Lord .......................... 148/1.5 |
| 4,986,215 A | 1/1991 | Yamada et al. ............. 118/728 |
| 5,188,501 A | 2/1993 | Tomita et al. .............. 414/416 |
| 5,242,501 A | 9/1993 | McDiarmid ................. 118/728 |
| 5,427,620 A | 6/1995 | deBoer et al. ............. 118/725 |
| 5,514,439 A | 5/1996 | Sibley ........................ 428/64.1 |
| 5,588,827 A | * 12/1996 | Muka ......................... 432/253 |
| 5,690,742 A | 11/1997 | Ogata et al. ................ 118/500 |
| 5,761,023 A | * 6/1998 | Lue et al. ................... 361/234 |
| 5,800,622 A | 9/1998 | Takemi et al. .............. 118/725 |
| 5,803,977 A | 9/1998 | Tepman et al. ............. 118/728 |
| 6,001,183 A | 12/1999 | Gurary et al. .............. 118/720 |
| 6,394,797 B1 | * 5/2002 | Sugaya et al. ............. 432/253 |

FOREIGN PATENT DOCUMENTS

| | | |
|---|---|---|
| JP | 07018438 | 1/1995 |
| JP | 08148541 | 6/1996 |
| JP | 2000315720 | 11/2000 |

* cited by examiner

Primary Examiner—Gregory Wilson
(74) Attorney, Agent, or Firm—Knobbe, Martens, Olson & Bear LLP

(57) ABSTRACT

An apparatus and method to position a wafer onto a wafer holder and to maintain a uniform wafer temperature is disclosed. The wafer holder or susceptor comprises a recess or pocket whose surface is concave and includes a grid containing a plurality of grid grooves separating protrusions. The concavity and grid grooves define an enclosed flow volume between a supported wafer and the susceptor surface, as well as an escape area, or total cross-sectional area of the grid grooves opening out from under the periphery of the wafer. These are chosen to reduce the wafer slide and curl during wafer drop-off and wafer stick during wafer pick-up, while improving thermal uniformity and reducing particle problems. In another embodiment, centering locators in the form of thin, radially placed protrusions are provided around the edge of the susceptor pocket to reduce further the possibility of contact between the wafer and the outer edge of the susceptor. These features help to achieve temperature uniformity, and therefore quality of the process result, across the wafer during processing.

46 Claims, 9 Drawing Sheets

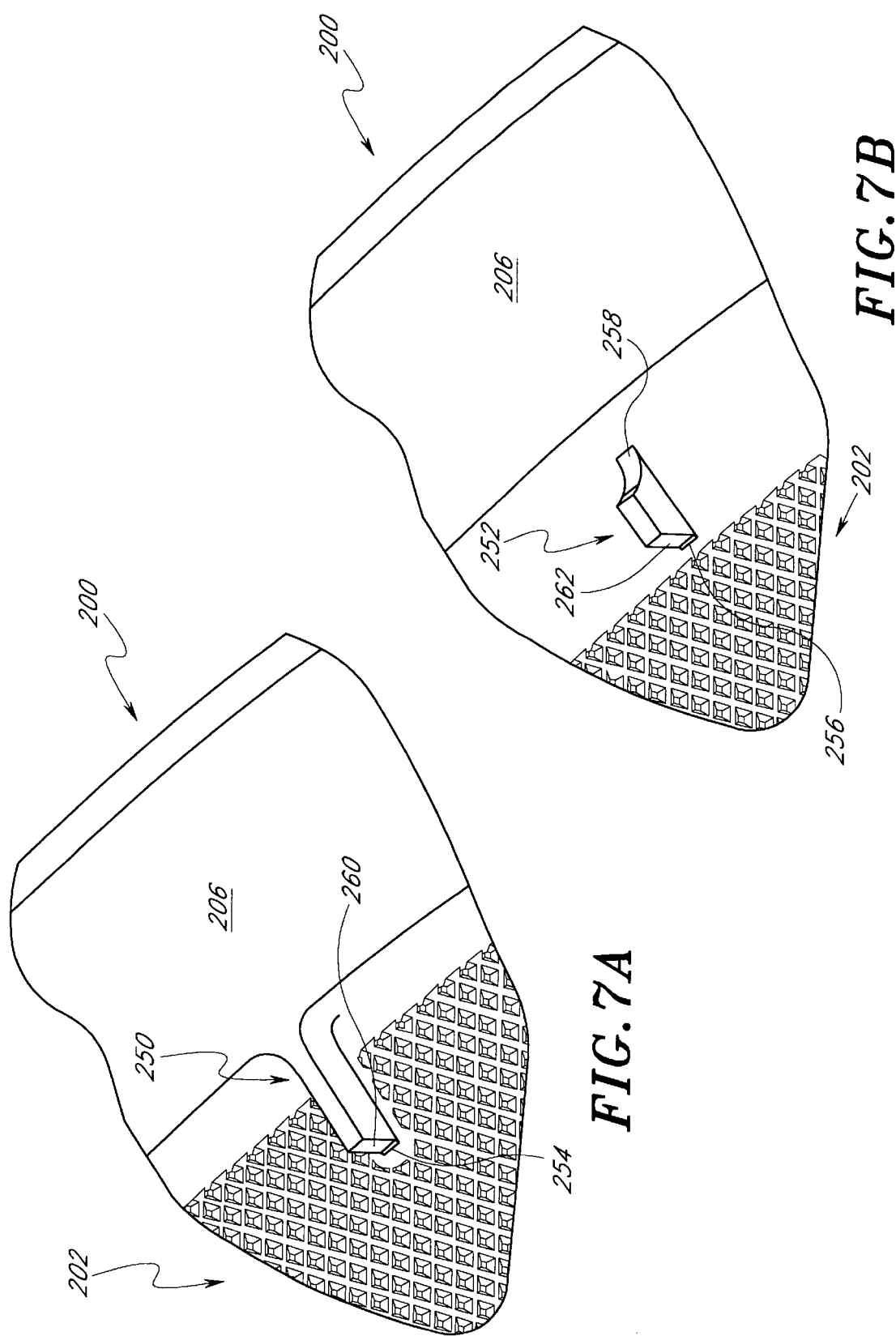

SUSCEPTOR POCKET PROFILE TO IMPROVE PROCESS PERFORMANCE

FIELD OF THE INVENTION

The invention relates generally to susceptors for supporting semiconductor substrates in process chambers, and, more particularly, to configuring wafer support surfaces to maintain uniform substrate temperature.

BACKGROUND AND SUMMARY OF THE INVENTION

Semiconductor fabrication processes are typically conducted with the substrate supported within a chamber under controlled conditions. For many processes, semiconductor substrates (e.g., silicon wafers) are heated inside the process chamber. For example, substrates can be heated by direct physical contact with a heated wafer holder and/or by radiation from a radiant heating source. "Susceptors," for example, are wafer supports that absorb radiant heat and transmit absorbed heat to the substrate.

In a typical process, a reactant gas is passed over the heated wafer, causing the chemical vapor deposition (CVD) of a thin layer of reactant material on the wafer. Through sequential processing, multiple layers are made into integrated circuits. Other exemplary processes include sputter deposition, photolithography, dry etching, plasma processing, and high temperature annealing. Many of these processes require high temperatures and can be performed in similar reaction chambers.

Various process parameters must be controlled carefully to ensure high quality in deposited films. One critical parameter is the temperature of the wafer during the processing. During CVD, for example, there is a characteristic temperature range in which the process gases react most efficiently for depositing a thin film onto the wafer. Temperature control is especially critical at temperatures below the mass transport regime, such as silicon CVD between about 500C and 900C (kinetic regime, about 500C to 900C for silicon CVD using silane). In this kinetic regime, if the temperature is not uniform across the surface of the wafer, the deposited film thickness will be uneven.

In recent years, single-wafer processing of large diameter wafers has become more widely used for a variety of reasons, including the need for greater precision in process control than can be achieved with batch-processing. Typical wafers are made of silicon, most commonly with a diameter of about 150-mm (6 inches) or of about 200-mm (8 inches) and with a thickness of about 0.725 mm. Recently, larger silicon wafers with a diameter of about 300 mm (12 inches) and a thickness of about 0.775 mm have been introduced, as they exploit, even more efficiently, the benefits of single-wafer processing. Even larger wafers are expected in the future.

The inventor has found many quality control problems affecting yield result from handling issues associated with susceptors, including substrate slide, stick and curl. These occur during placement and subsequent removal of substrates in high temperature process chambers.

Slide occurs during drop off when a cushion of gas in the susceptor recess or pocket is unable to escape fast enough to allow the substrate to fall immediately onto the susceptor. The substrate floats momentarily above the susceptor as the gas slowly escapes, and it tends to slide off center. Thus, the substrate may not rest in the center of the pocket where it was intended, and uneven heating of the substrate may result. Sliding to the edge of a susceptor pocket causes local cooling where the substrate is in contact with the pocket edge and results in poor thickness uniformity, poor resistivity uniformity and crystallographic slip, depending on the nature of the layer being deposited. These non-uniformities, due to inconsistencies in the wafer drop position, greatly increase the difficulty in optimal tuning of the process. Similarly, non-uniformities in temperature can cause non-uniformities in etch, anneal, doping, oxidation, nitridation and other fabrication processes.

Conversely, during pickup, stick occurs when the substrate clings to the underlying support because gas is slow to flow into the small space between the wafer and the surface of the pocket. This creates a vacuum effect between the substrate and the support as the substrate is lifted. Stick is a potential contributor to particle contamination and, in extreme cases, has caused lifting of the substrate holder on the order of 1 to 2 mm.

Curl is warping of the substrate caused by a combination of both radial and axial temperature gradients in the substrate. Severe curl can cause the substrate to contact the bottom side of a Bernoulli wand, and can similarly affect interaction with other robot end effectors. In the case of a Bernoulli wand, the top side of the substrate can scratch the Bernoulli wand and cause particulate contamination, significantly reducing yield. The design and function of a Bernoulli wand are described in U.S. Pat. No. 5,997,588 and are included by reference herein.

FIGS. 1A and 1B show a wafer 1 supported upon a susceptor 100, wherein the susceptor 100 has a gridded support surface G. Referring initially to FIG. 1A, a portion of the wafer 1, close to a peripheral edge 2 thereof, is shown on the grid G. An upper surface of the grid G is defined by a plurality of projections 3 separated from one another in two dimensions by a plurality of grid grooves. These projections 3 are recessed with respect to the upper surface of an annular shoulder 4 surrounding the grid. For a 200-mm wafer, the depth of this recess or pocket is about 0.018 inches (0.457 mm), while the thickness of a 200-mm wafer is about 0.285 inches. Thus, the top surface of the wafer 11 rises slightly above the top surface of the shoulder 4, which helps to maintain laminar gas flow over the wafer. An outer circumference 5 of the grid G is separated from an inner edge 6 of the shoulder 4 by an annular groove 7, which is approximately semicircular in cross section. The depth of annular groove 7 into the susceptor 100 is about the same as the depth of the grid grooves. The diameter of the inner edge 6 of the shoulder 4 is slightly larger than the diameter of the wafer 1 to allow tolerance for positioning the wafer in the pocket. Similar gridded susceptors are commercially available from ASM America, Inc. of Phoenix, Ariz. for use in its Epsilon™ series of CVD reaction chambers.

In FIG. 1A, the wafer 1 is centered over the pocket with equal spacing between wafer edge 2 and shoulder edge 6 all around the wafer. However, as shown in FIG. 1B, upon initial placement, the wafer 1 tends to slide and/or jump, and its outer edge 2 often makes contact with or comes in close proximity to the inner edge 6 of the shoulder 4. The shoulder 4 is thicker and thus generally cooler than the wafer 1 and the underlying grid G. As a result, the edge 2 of the wafer tends to cool by conduction. The wafer edge 2 will also lose heat through radiation if it is very near to the shoulder edge 6, even if they are not actually in contact.

Cooling at the wafer edge renders the temperature of the wafer non-uniform. Given that thin film deposition rates (and many other fabrication processes) are strongly temperature dependent, especially for CVD in the kinetic regime, film thickness, and resistivity, will be non-uniform across a wafer processed under conditions of temperature non-uniformity. Consequently, there is a need for an improved substrate support that facilitates substrate pick-up and drop-off while promoting temperature uniformity.

In satisfaction of this need and in accordance with one aspect of the invention, a substrate support is provided with a grid of grooves extending into a concave surface, which can hold a generally flat substrate, such as a silicon wafer, for processing. The concavity and grooves are configured to minimize stick, slide and curl, while still maintaining desirable thermal properties. Methods for configuring the support and for supporting a substrate thereon are also provided.

In accordance with another aspect of the invention, centering locators, arranged radially along an inside edge of an annular shoulder of a substrate holder, are supplied. The centering locators establish a distance between the substrate and the annular shoulder to prevent direct thermal contact therebetween.

BRIEF DESCRIPTION OF THE DRAWINGS

Further features and advantages of the present invention will become apparent from the detailed description of preferred embodiments that follow, when considered together with the attached drawings, which are intended to illustrate and not to limit the invention.

FIG. 7A is a perspective view of a portion of a susceptor constructed in accordance with another embodiment of the invention wherein the outer edge of a centering locator is in contact with the susceptor shoulder.

FIG. 7B is a perspective view of a portion of a susceptor constructed in accordance with an embodiment of the invention wherein the outer edge of a centering locator is spaced inwardly from the susceptor shoulder.

DETAILED DESCRIPTION OF THE PREFERRED EMBODIMENT

As noted in the Background and Summary section above, the inventor has found significant problems with respect to transfer of substrates onto and from conventional substrate holders. In dropping substrates onto the holders, substrate slide makes it difficult to accurately place the substrate in the center of the holder with good reproducibility. When the holder is heated, particularly when the holder is a heated susceptor in a cold-wall reactor, a substrate dropped onto the susceptor also tends to curl due to transitory temperature differentials within the substrate. Curl can cause "jump" and move the substrate from its desired position. Due to unpredictable placement of the substrate upon the susceptor, it is difficult to accurately tune the temperature control mechanisms for uniform heating of the substrate, especially for low temperature processes.

Furthermore, curl can cause scratching of the wafer-handling end effector and dropping of the substrate, leading to particulate contamination. In removing the wafer from the holder, the wafer tends to stick to the holder (known as "stiction"), sometimes lifts the susceptor and drops it back onto the supporting structure, thus causing further particle generation. These particle problems can cause contamination of whole wafers, or even batches of wafers, significantly reducing yield.

Figure 1A:
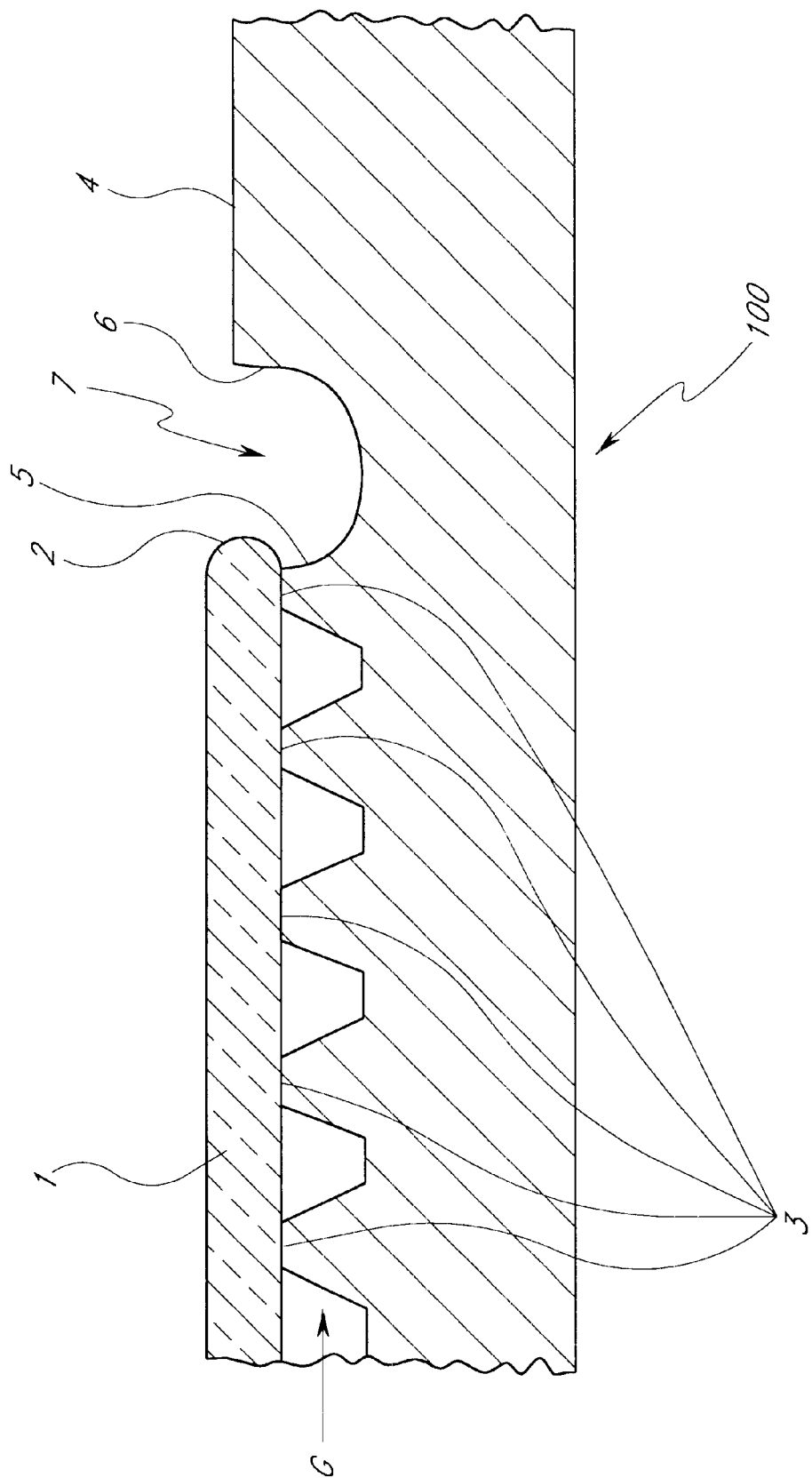
FIG. 1A is a schematic cross-sectional view of a wafer centered on a susceptor.
Figure 1B:
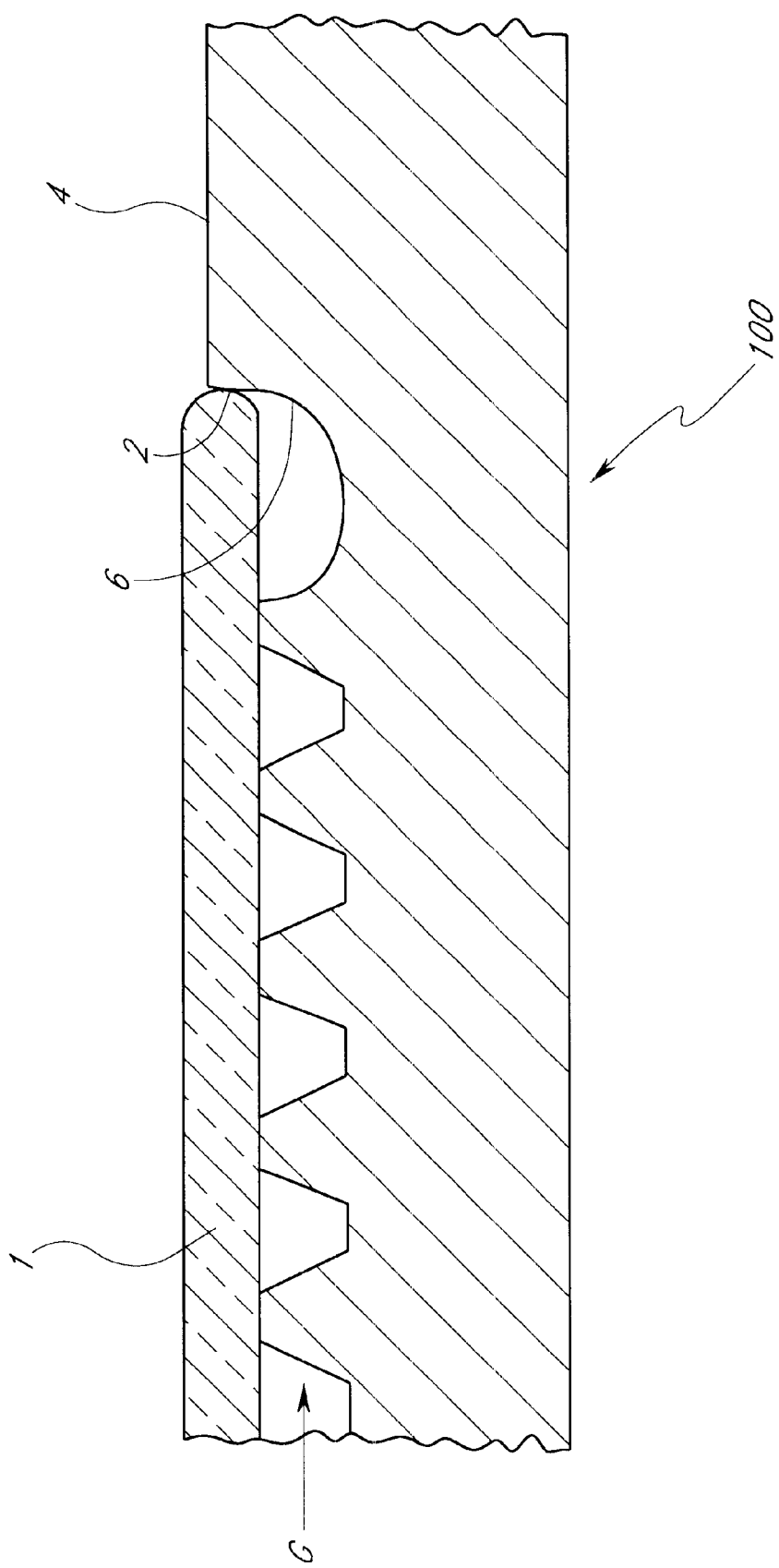
FIG. 1B is a schematic cross-sectional of a wafer positioned off center on the susceptor of FIG. 1A.
Figure 2:
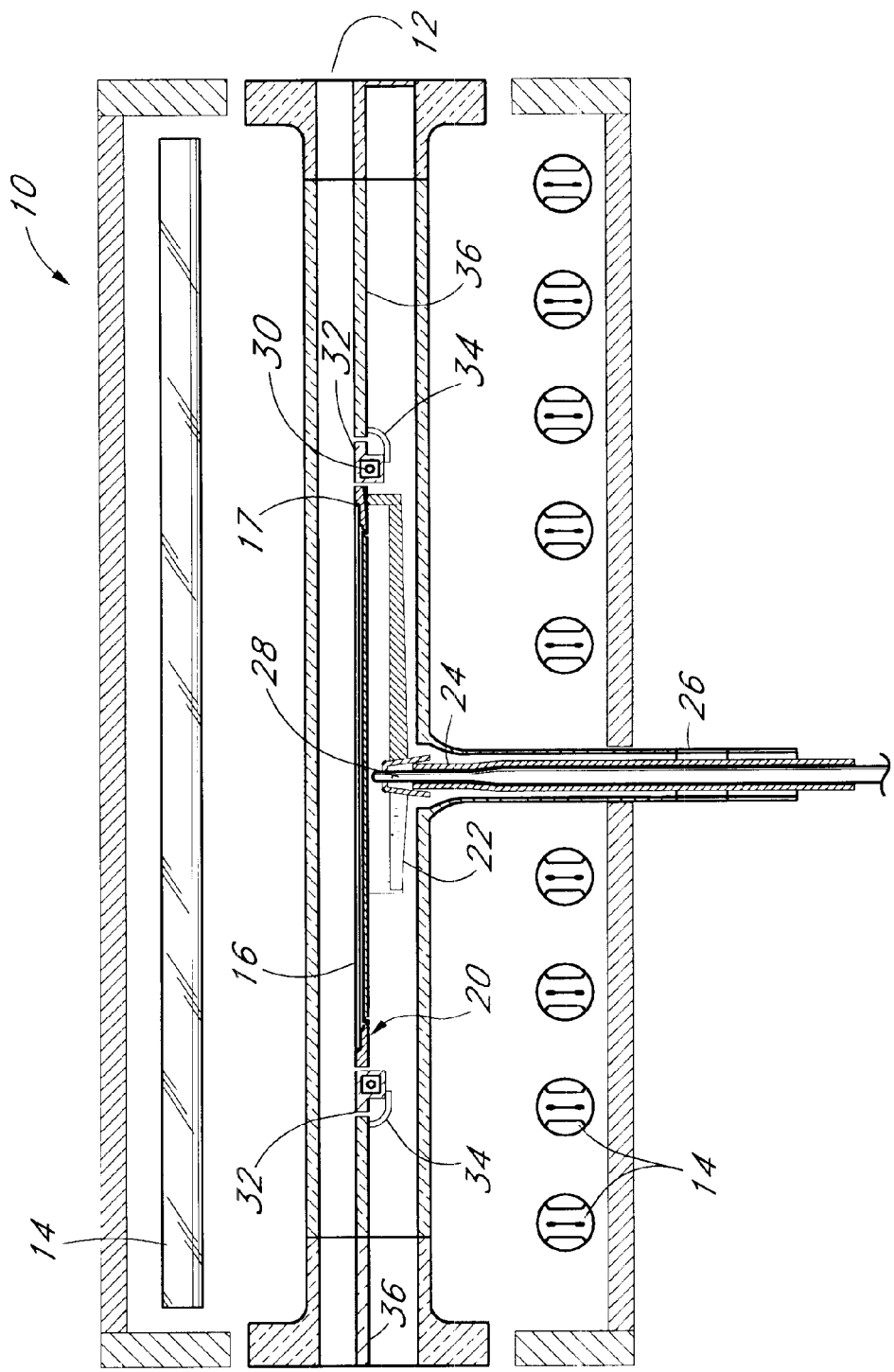
FIG. 2 is a schematic, cross-sectional view of an exemplary reaction chamber with a wafer supported on a susceptor therein.

FIG. 2 illustrates an exemplary chemical vapor deposition (CVD) reactor 10, including a quartz reaction chamber 12. Radiant heating elements 14 are supported outside the quartz chamber 12, to provide heat energy to the chamber 12 without appreciable absorption by the chamber walls. Although the preferred embodiments are described in the context of a "cold wall" CVD reactor, it will be understood that the wafer support systems described herein also have utility in reactors of other types. In particular, one of skill in the art can find application for the wafer support systems described herein for other semiconductor processing equipment, wherein a substrate is supported while being uniformly heated or cooled. Moreover, while illustrated in the context of standard silicon wafers, the supports described herein can be used to support other kinds of substrates, such as glass, which are subjected to treatments such as CVD, physical vapor deposition (PVD), etching, annealing, dopant diffusion, photolithography, etc. The supports are of particular utility for supporting substrates during treatment processes at elevated temperatures.

The illustrated substrate comprises a semiconductor wafer 16 with a generally circular edge 17, shown in FIG. 2 supported within the reaction chamber 12 upon a wafer support structure. The support structure includes a wafer holder or support 200, upon which the wafer 16 rests, and a spider 22, preferably made of an insulating material, which supports the wafer holder 200. The spider 22 is mounted to a shaft 24, which extends downwardly through a tube 26 depending from the lower wall of the chamber. In the illustrated embodiment, the wafer holder 200 comprises a susceptor capable of absorbing radiant energy from the heating elements 14. It is preferable that the upper surface of the susceptor is solid and made of one piece.

A central temperature sensor or thermocouple 28 extends through the shaft 24 and the spider 22 in proximity to the wafer holder 200. Additional peripheral thermocouples 30 are also shown housed within a slip ring or temperature compensation ring 32, which surrounds the wafer holder 200 and the wafer 16. The thermocouples 28, 30 are connected to a temperature controller (not shown), which sets the power of the various heating elements 14 in response to the readings of the thermocouples 28, 30.

In addition to housing the thermocouples 30, the slip ring 32 absorbs radiant heat during high temperature processing. This compensates for a tendency toward greater heat loss at the wafer edge 17, a phenomenon that is known to occur due to a greater concentration of surface area for a given volume near such edges. By minimizing edge losses and the attending radial temperature non-uniformities across the wafer 16, the slip ring 32 can help to prevent crystallographic slip and other problems associated with temperature non-uniformities across the wafer. The slip ring 32 can be suspended by any suitable means. For example, the illustrated slip ring 32 rests upon elbows 34, which depend from the quartz chamber dividers 36.

With reference to FIGS. 3–6, the wafer holder of the preferred embodiment is shown. As noted above, the illustrated wafer holder is a susceptor 200 capable of absorbing radiant energy from the heating elements 14. The susceptor 200 is preferably made of graphite coated with silicon carbide, although the skilled artisan will appreciate that other materials are also suitable. The illustrated susceptor 200 is of a type considerably more massive than the wafer to be supported, preferably more than five times and more preferably between about 7 and 9 times the thermal mass of the wafer, such that it can serve as a "thermal flywheel" to maintain temperature stability. Additionally, the susceptor 200 is preferably "solid," i.e., does not contain openings therethrough. Such openings risk backside deposition as well as alter thermal properties.

Figure 3B:
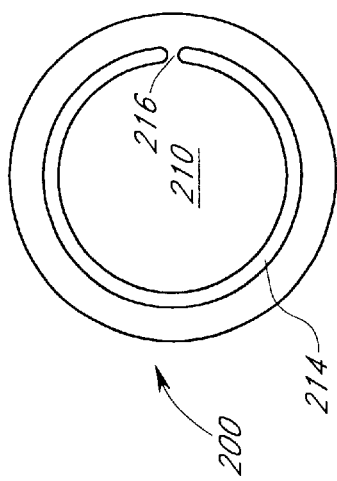
FIG. 3B is a bottom plan view of the susceptor of FIG. 3A.
Figure 3C:
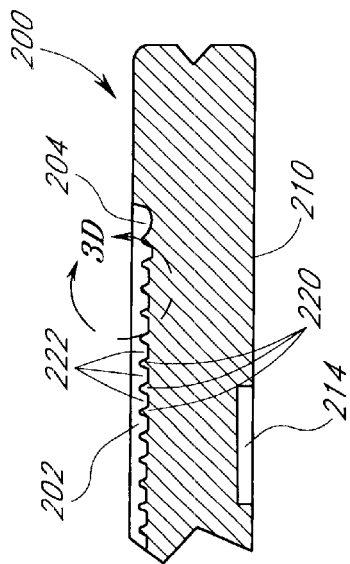
FIG. 3C is a partial cross-sectional view of the susceptor of FIG. 3A taken along line 3C—3C of FIG. 3A.
Figure 3A:
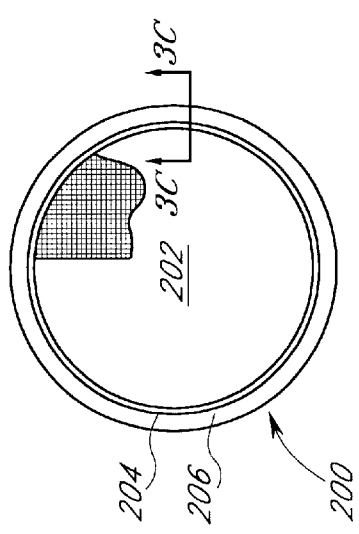
FIG. 3A is a top plan view of a susceptor with a gridded pocket for holding a wafer, constructed according to a preferred embodiment of the present invention.

FIG. 3A shows the susceptor 200 as viewed from the top, that is, looking into a recessed pocket 202 in which the wafer will be supported. The recessed pocket 202 has a set of perpendicular, crossing grid grooves cut into its concave surface and surrounded by an annular groove 204. These features will be described in more detail with respect to FIG. 3D below. While shown across only a portion of the susceptor pocket 202, it will be appreciated that the grid extends across the full susceptor pocket 202 up to the annular groove 204. A raised shoulder 206 circumscribes the annular groove 204. In an embodiment designed to support 200-mm wafers, for example, the diameter of the susceptor 200 to the outer edge of the annular groove is about 8.000±0.005 inches, or slightly larger than the wafer which it is to support, and the overall diameter of the susceptor is about 8.850±0.005 inches. The tops of the grid protrusions along the circumference closest to the edge of the pocket define a plane on which the wafer rests, which is between about 0.010 and 0.025 inch, more preferably between about 0.015 and 0.200 inch and most preferably about 0.018 inch below the top surface of the annular, raised shoulder 206, about 0.010 inch less than the thickness of a standard 200-mm wafer.

A bottom plan view of the susceptor is shown in FIG. 3B. The bottom surface 210 includes a bottom groove 214, about 0.250 inch in width and with a rectangular cross section, which forms a nearly complete concentric circle and has an outer diameter of about 5.250±0.005 inches. The bottom groove 214 does not form a complete circle but is interrupted by a section 216, shown on the right side of FIG. 3B. The illustrated interrupting section 216 has a length of about 0.250 inch. The bottom groove 214 accepts fingers of the spider 22 (FIG. 2) and the interrupting section 216 ensures that the spider 22 cannot rotate independently of the susceptor 200 once it has locked in position against section 216.

FIG. 3C is a cross-sectional view of an area of the susceptor 200 near the periphery along the line 3C—3C in FIG. 3A. On the top surface, the pocket 202 is shown with a plurality of grid protrusions 220 separated by a plurality of parallel grid grooves 222, perpendicular to the plane of the page. The skilled artisan will appreciate that there is a second set of similar, parallel grid grooves (not visible in this view), perpendicular to the illustrated grid grooves 222 and parallel to the plane of the page. Thus the protrusions 220 can be understood as small, square islands, bordered on two parallel sides by one set of grid grooves 222 and on the other two parallel sides by the second set of grid grooves not seen in this view. The annular groove 204, the susceptor shoulder 206 and the relative positions thereof are also shown. On the bottom surface 210, the rectangular cross section of bottom groove 214 is shown.

Figure 3D:
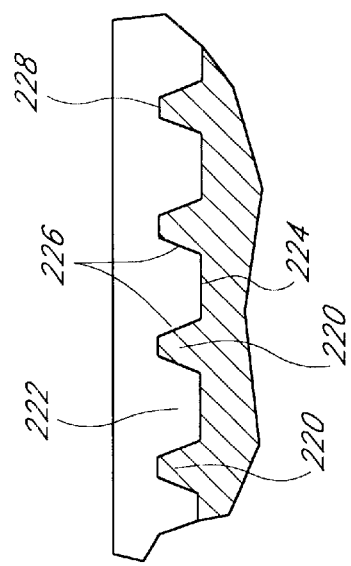
FIG. 3D is an enlarged cross-sectional view of a portion of the support grid of FIG. 3C.

FIG. 3D is a detail of the pocket 202 surface shown in the circle labeled 3D in FIG. 3C. Each grid groove 222 has a flat grid floor or bottom 224 and sidewalls 226 that slant outward and subtend an included angle of 45°. The protrusions 220 between the grid grooves 222 have flat tops 228 that define the support surface of the pocket 202. In the illustrated embodiment, the tops are square with a width and length of about 0.008 inch by 0.008 inch (0.20 mm by 0.20 mm), while the flat bottom portions 224 of the grid grooves 222 are about 0.221 inch (0.56 mm) in width.

The difference in height between the protrusion top 228 and the grid groove bottom 224 is preferably between about 0.35 mm and 0.55 mm, more preferably between about 0.40 mm and 0.45 mm (nominal 0.43 mm or 0.017 inch in the illustrated embodiment). The pitch of the grid, or distance between identical adjacent features, is preferably between about 1.0 mm and 1.5 mm, more preferably between about 1.2 mm and 1.3 mm in both directions (nominally 1.27 mm or 0.050 inch in the illustrated embodiment).

Similar gridded susceptors have been available from ASM America, Inc. of Phoenix, Ariz. for use in the Epsilon™ series of CVD reactors. These susceptors, however, had different grid configurations. For instance, the pitch of the grid in prior susceptors was about half that of the preferred embodiment. Furthermore, the prior susceptors were designed to be nearly planar, with the exception of a minimal manufacturing tolerance for concavity (e.g., from 0 to 0.005 inch or 0.127 mm), as compared to the peripheral portions of the grid, simply to avoid a convex shape. As detailed below with respect to FIG. 4, the preferred embodiments feature a significant amount of concavity or bowl-shape for improved wafer handling.

Figure 4:
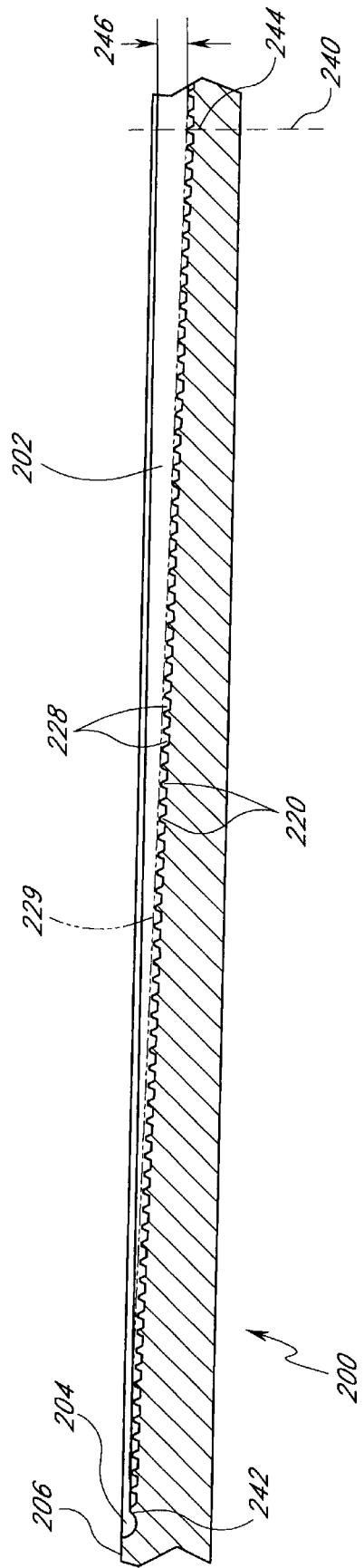
FIG. 4 is a schematic cross-sectional view of a portion of the susceptor of FIG. 3A, with an exaggerated concavity in the pocket surface to illustrate a preferred embodiment of the present invention.

With reference to FIG. 4, an upper portion of the susceptor 200 is shown in cross section. The view extends from the centerline 240 of the susceptor to the annular shoulder 206. Only a portion of the annular shoulder 206 is shown. An upper surface 229 of the pocket 202 is defined by the top surfaces 228 of the grid protrusions 220. The upper surface 229 slopes gradually downward from a peripheral grid protrusion 242 to a center grid protrusion 244. Although it is not shown, it will be understood that the upper surface 229 also slopes upward from the center grid protrusion 244 to another peripheral grid protrusion 220 at the other end of the pocket 202. The pocket 202 thus has circular symmetry, forming an overall concave shape. The concavity and grid structure of the susceptor pocket surface have been exaggerated for the purpose of illustration.

The concavity of the upper surface 229 is defined by the difference 246 in depth, relative to the top of the shoulder 206, for example, between the top of a grid protrusion 242 on the periphery (adjacent to the annular groove 204) and the top of the grid protrusion 244 (at the center 240 of the pocket 202). The concavity 246 is preferably between about 0.130 mm and 0.500 mm. For susceptors designed for 150-mm wafers, the concavity 246 is more preferably between about 0.130 mm and 0.200 mm, and most preferably between about 0.130 mm and 0.150 mm (nominally 0.1397 mm or 0.0055 inch in an exemplary 150-mm embodiment). For susceptors designed for 200-mm wafers, the concavity 246 is more preferably between about 0.130 mm and 0.250 mm, and most preferably between about 0.170 mm and 0.220 mm (nominally 0.1905 mm or 0.0075 inch in an exemplary 200-mm embodiment). For susceptors designed for 300-mm wafers, the concavity 246 is more preferably between about 0.300 mm and 0.500 mm, and most preferably between about 0.360 mm and 0.400 mm. As the substrate size increases, the concavity is preferably increased more than proportionately.

Figure 5:
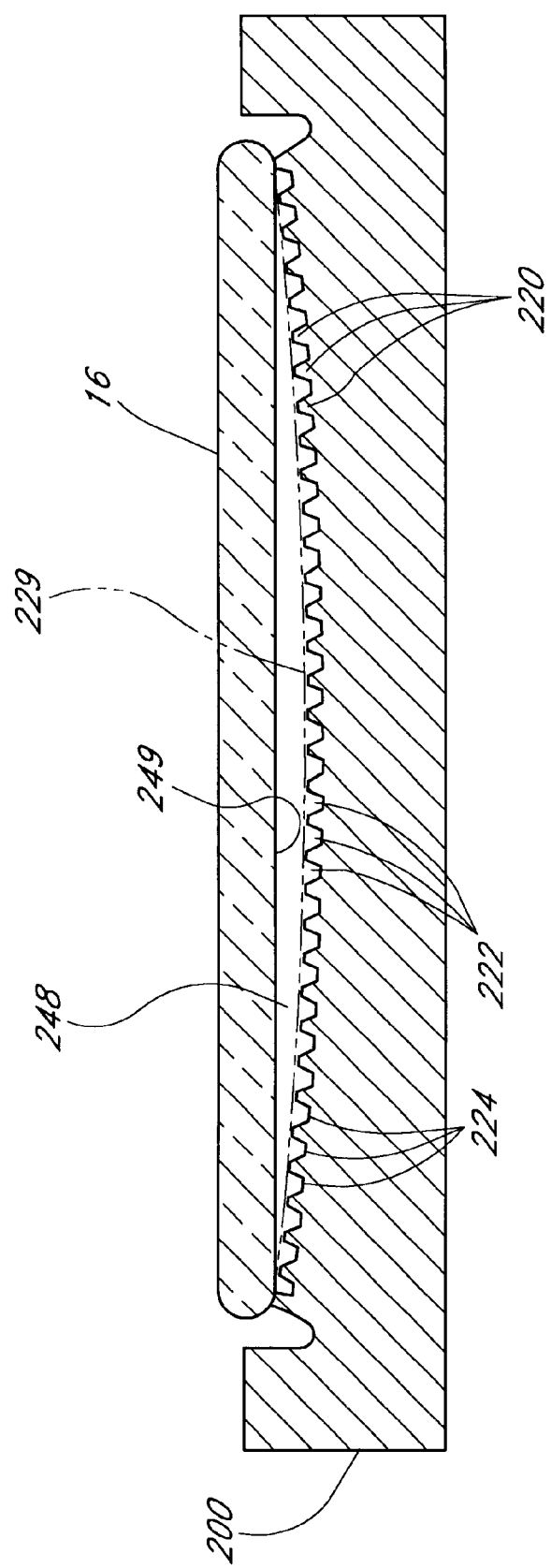
FIG. 5 is a schematic cross-sectional drawing illustrating an enclosed volume between a supported wafer and the susceptor of FIG. 3A.

FIG. 5 illustrates the wafer 16 in position in the pocket of the preferred susceptor 200. The curvature and the grid structure of the pocket surface are exaggerated to illustrate the arrangement more clearly. The volume "enclosed" between the wafer 16 and the underlying susceptor 200 is indicated by reference numeral 248 in FIG. 5 and is referred to herein as the "flow volume," as will be appreciated from the discussion below. The enclosed flow volume 248 includes both the space between the lower surface 249 of the wafer 16 and the upper surface 229 of the grid, and the volume within the grid grooves 222 (i.e., the volume between the lower surface 249 and the floors 224 of the grid grooves 222).

Figure 6A:
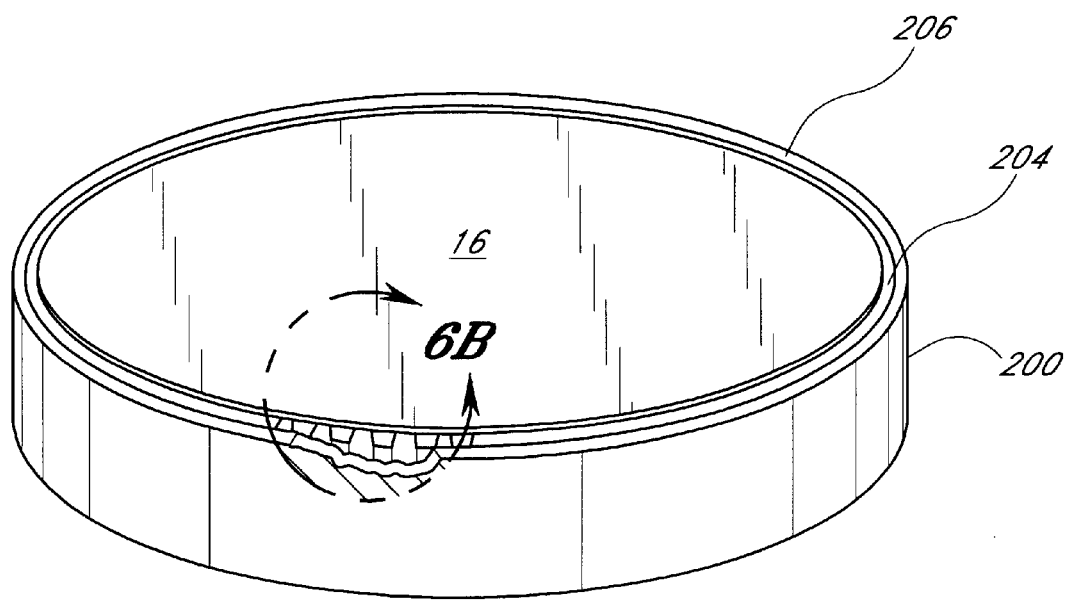
FIG. 6A is a schematic perspective and partially cut away view of a wafer supported on the susceptor of FIG. 3C.

FIG. 6A is a perspective view of the substrate or wafer 16 in position on the susceptor 200 of the preferred embodiment. The cut-away portion shows the edge 17 of the wafer 16 overlying protrusions 220 at or near the periphery of the susceptor pocket. The scale of the grid is exaggerated for the purpose of illustration.

Figure 6B:
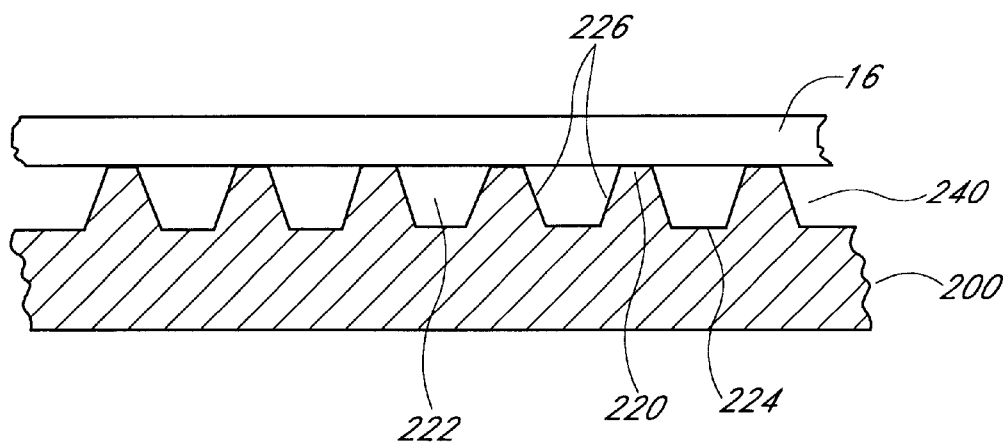
FIG. 6B is an enlarged cross-sectional view of the circled region in FIG. 6A showing the support grid beneath a perimeter of the wafer. The cross section follows the curve of the wafer edge.

FIG. 6B shows the wafer edge 17 in contact with the grid protrusions 220 at the outer edge of the susceptor pocket and viewed edge on. The grid is sectioned along a projection of the wafer edge or perimeter 17 downward into the grid. This projection intercepts a plurality of grid grooves 222, as shown. The cross section thus depicts the openings of grid grooves 222 at the wafer edge 12. Gas (e.g., air or inert gas in the chamber) passes out through these openings during wafer drop-off and in through these openings during wafer pick-up. Accordingly, the sum of the cross-sectional areas of the grid grooves 222 opening out from underneath the wafer 16 is referred to herein as the "escape area" of the susceptor 200. The total escape area is the sum of all these areas around the circumference of the wafer through which gas can escape as a wafer is dropped onto susceptor 200, or through which gas can be drawn into the susceptor during wafer pick up.

The susceptor's enclosed flow volume and total escape area are optimized to minimize wafer slide, stick and curl while maintaining good thermal exchange properties and minimizing the risk of process gases reaching the backside of the wafer. In preferred embodiments, these parameters have been separately tailored for wafers with 6-inch or 150-mm diameters, with 8-inch or 200-mm diameters and with 12-inch or 300-mm diameters. For larger wafer sizes, the flow volume and total escape area preferably increase more than proportionately to the wafer areas because of the increased distance and increased volume of gas traveling to reach the wafer periphery.

As noted, the total enclosed flow volume includes the volume between the substrate lower surface 249 and the susceptor pocket upper surface 229 defined by the protrusion tops 228, as well as the volume within the grid grooves 222. For a susceptor designed to support a 150-mm wafer, the total enclosed flow volume is preferably between about $7.5 \times 10^{-6}$ $m^3$ and $10.0 \times 10^{-6}$ $m^3$ and more preferably between about $8.0 \times 10^{-6}$ $m^3$ and $9.0 \times 10^{-6}$ $m^3$. For susceptors designed to support wafers 200 mm imn diameter or larger, the total enclosed flow volume is between $1.3 \times 10^{-5}$ $m^3$ and $6.0 \times 10^{-5}$ $m^3$. The total enclosed volume for a susceptor designed to support a 200-mm wafer is preferably between about $1.3 \times 10^{-5}$ $m^3$ and $4.0 \times 10^{-5}$ $m^3$, more preferably between about $1.4 \times 10^{-5}$ $m^3$ and $1.6 \times 10^{-5}$ $m^3$ ($1.506 \times 10^{-5}$ $m^3$ in an exemplary 200-mm susceptor). For a susceptor designed to support a 300-mm wafer, the total enclosed flow volume is preferably between about $3.0 \times 10^{-5}$ $m^3$ and $6.0 \times 10^{-5}$ $m^3$, more preferably between about $3.5 \times 10^{-5}$ $m^3$ and $4.5 \times 10^{-5}$ $m^3$ (or $4.062 \times 10^{-5}$ m3 in an exemplary 300-mm susceptor).

xx For 6-inch or 150-mm wafers, the escape area of the susceptor is preferably between about $0.1 \times 10^{-4}$ $m^2$ and $5.0 \times 10^{-4}$ $m^2$ and more preferably between about $2.0 \times 10^{-4}$ $m^2$ and $3.0 \times 10^{-4}$ $m^2$. For 200-mm wafers, the escape area of the susceptor is preferably between about $2.0 \times 10^{-4}$ $m^2$ and $4.0 \times 10^{4}$ $m^2$ and more preferably between about $2.5 \times 10^{-4}$ $m^2$ and $3.5 \times 10$ $m^2$ ($3.096 \times 10^{-4}$ $m^2$ in an exemplary 200-mm susceptor). In another embodiment of the current invention, these parameters are optimized for 12-inch or 300-mm wafers. The escape area is preferably between about $3.0 \times 10^{-4}$ $m^2$ and $6.0 \times 10^{-4}$ $m^2$, more preferably between about $4.0 \times 10^{-4}$ $m^2$ and $5.0 \times 10^{-4}$ $m^2$ ($4.643 \times 10^{-4}$ $m^2$ in an exemplary 300-mm susceptor).

In the preferred embodiment, a susceptor with a flat pocket surface is machined from graphite. The susceptor is coated with silicon carbide at an elevated temperature, preferably between about 1000C and 1500C, more preferably between 1250C and 1350C. As the susceptor cools down the mismatch in thermal expansion coefficient between the graphite and the silicon carbide cause the susceptor to bend, causing the concavity of the pocket surface. This embodiment is meant to illustrate a preferred method of introducing concavity into the susceptor pocket surface. The skilled artisan will find other methods for producing concavities according to the preferred embodiments described above.

The introduction of concavity into the susceptor surface, along with deeper and wider grooves, produces the total enclosed flow volume. This flow volume, along with the escape area (total cross-sectional area of the groove openings at the wafer perimeter), can accommodate the sudden drop of a wafer without creating a compressed cushion of gas with enough pressure to cause the wafer to skate or slide. In part, the enlarged flow volume assists in absorbing the compression of gas without excessive pressurization and, in part, the escape area enables the gas to escape quickly so that not enough of a cushion is created upon drop-off to even temporarily support the wafer. The wafer rests upon the support grid in the centered location for which the wafer transfer robot was programmed.

In addition, using the pocket profiles of the preferred embodiments, no significant suction effect is created between the wafer and the susceptor when the wafer is picked up by a robot end effector, such as a Bernoulli wand. This improvement in pick-up reduces particle generation.

Advantageously, the preferred flow volumes and escape areas are achieved without creating a sharp thermal transition, such as a ledge, in the susceptor. Thus, the grid continues to extend beneath the entire wafer surface, and the small space between the central protrusions and the wafer has no adverse effect on the thermal interaction between the wafer and the susceptor. In fact, improvements in film deposition uniformity and repeatability are achieved due to more consistent placement of the wafer with respect to the susceptor, such that temperature tuning applies equally well to multiple wafers sequentially processed. In contrast, prior susceptor designs showed localized cold spots when the wafer slid into contact with the pocket edge. Repeated tests of depositions performed on a wafer supported by a gridded susceptor in accordance with the preferred embodiments showed excellent reproducibility and low standard deviation in deposited layer thickness. Table I illustrates the deposition uniformity achieved with the new susceptors.

TABLE I

| Wafer | Mean Film Thickness (Å) | Standard Deviation (Å) |
| --- | --- | --- |
| 1 | 1101 | 5.5 |
| 2 | 1101 | 7.0 |
| 3 | 1099 | 7.2 |
| 4 | 1108 | 8.2 |
| 5 | 1098 | 7.2 |
| 6 | 1095 | 7.2 |
| 7 | 1098 | 7.2 |
| 8 | 1094 | 6.4 |
| 9 | 1090 | 7.3 |
| 10 | 1095 | 6.4 |
| 11 | 1100 | 6.9 |
| 12 | 1094 | 7.1 |
| 13 | 1088 | 6.6 |
| 14 | 1098 | 7.8 |
| 15 | 1103 | 6.0 |
| 16 | 1100 | 7.1 |
| 17 | 1115 | 8.2 |
| 18 | 1119 | 8.9 |
| 19 | 1115 | 9.8 |
| 20 | 1105 | 8.9 |
| 21 | 1112 | 7.5 |
| 22 | 1111 | 8.6 |
| 23 | 1113 | 9.8 |

Moreover, better control over centered drop-off also avoided catastrophic failure in processing. In depositions performed using the preferred embodiments, no slide was observed; wafers remained centered as dropped, and the deposited films were within control limits.

In experiments performed using a gridded susceptor without concavity and with narrower grooves, on the other hand, unacceptable films were observed, as indicated in Table II. The wafers in Tables I and II were processed in the same type of chamber and in a similar temperature range, although the process recipes were not identical.

TABLE II

| Wafer | Mean Film Thickness (Å) | Standard Deviation (Å) |
| --- | --- | --- |
| 1 | 1703 | 12.2 |
| 2 | 1706 | 8.4 |
| 3 | 1724 | 10.1 |
| 4 | 1662 | 48.6 |
| 5 | 1709 | 7.9 |
| 6 | 1706 | 12.3 |
| 7 | 1635 | 45.0 |
| 8 | 1635 | 42.8 |
| 9 | 1709 | 8.7 |
| 10 | 1709 | 11.4 |
| 11 | 1709 | 8.2 |

TABLE II-continued

| Wafer | Mean Film Thickness (Å) | Standard Deviation (Å) |
| --- | --- | --- |
| 12 | 1705 | 11.3 |
| 13 | 1720 | 7.2 |
| 14 | 1706 | 8.7 |
| 15 | 1611 | 53.2 |
| 16 | 1635 | 44.8 |
| 17 | 1709 | 7.5 |
| 18 | 1701 | 13.5 |
| 19 | 1711 | 15.0 |
| 20 | 1705 | 16.6 |
| 21 | 1697 | 16.3 |
| 22 | 1709 | 10.1 |

Wafers 4, 7, 8, 16 and 17, had radically higher standard deviations and therefore, much greater variation in film thickness as compared to the wafers in Table I. This is an indication that wafer slide to contact the shoulder 206 of the susceptor 200 has occurred for these wafers. A significant temperature differential due to this contact results in varying deposition rates across the wafer 16 and, therefore, a non-uniform film Additionally, the concavity 246 (FIG. 4) in the susceptor upper surface 229 reduced the occurrence of wafer curl. With reference to FIG. 2, when initially introduced into the chamber 12 and held over the susceptor 200, a wafer 16 is heated disproportionately from below. Accordingly, the hotter temperature on the bottom surface of the wafer 16 results in greater thermal expansion on the bottom surface and, therefore, in a sight amount of upward curl. The wafer has a bowl or concave shape with a concavity on the order of about 0.010 inch. Concavity in this context refers to the depth from the highest point of the wafer (generally the edge) to the lowest point of the wafer (generally the center). If dropped onto a "flat" gridded susceptor, the center of the wafer 16 first contacts the susceptor, introducing radial temperature gradients. This quickly exacerbates the curl effect, such that the concavity increases to about 0.350 inch upon contact, often scratching the end effector before it can be withdrawn and sometimes resulting in breaking of the wafer.

In contrast, the susceptor concavity in the preferred embodiments makes a susceptor that conforms better to the shape of the slightly curled wafer when the wafer is dropped off, thus making more continuous thermal contact therewith. Wafer curl is reduced to a concavity of about 0.200 inch, which is insufficient to scratch the Bernoulli wand. By avoiding wand scratching and attendant particle problems, yield has been shown to improve by 30% to 40%.

FIGS. 7A and 7B illustrate a susceptor 200 constructed in accordance with another embodiment, whereby centering is improved, and thermal non-uniformity from contacting the wall at the edge of the pocket 202 is avoided. The illustrated embodiment also contains a gridded susceptor, such that similar elements to those of the previous embodiment will be referenced by like reference numbers.

The susceptor 200 includes a central gridded pocket 202, on which a wafer can be positioned, and a plurality of centering locators 250 or 252 on the periphery of the pocket 202. The locators 250 or 252 extend above the level of the grid and keep the wafer from coming into contact with the annular shoulder 206, which would cause cooling at the wafer edge, as mentioned above. The wafer edge can make contact with the locators 250 or 252, so the locators 250 or 252 are designed to minimize any adverse thermal impact this might have. The centering locator 250 of FIG. 7A has contact with the annular shoulder 206 along only the smallest side of the locator. Leaving a space between the centering locators and the annular shoulder, as shown in FIG. 7B is the preferred arrangement, but even centering locators attached to the annular shoulder 206 as shown in FIG. 7A, are an improvement over risking wafer contact with the annular shoulder 206 itself. The narrow locators keep the wafer away from the much greater thermal mass of the annular shoulder 206, where the cooling effect would be great.

The width of each locator along a circumference of the recess, or along surfaces 260, 262 in FIGS. 7A and 7B, respectively, is less than about 1.50 mm. The upper surfaces of the locators are about level with the upper surface of the annular shoulder 206. In FIG. 7A, the radial length of each locator at its upper surface is preferably between about 1.00 and 2.00 mm. In FIG. 7B, the outer edge 258 of each locator is spaced between about 0.50 mm and 2.00 mm from the inner circumference of the annular shoulder 206.

Figure 8:
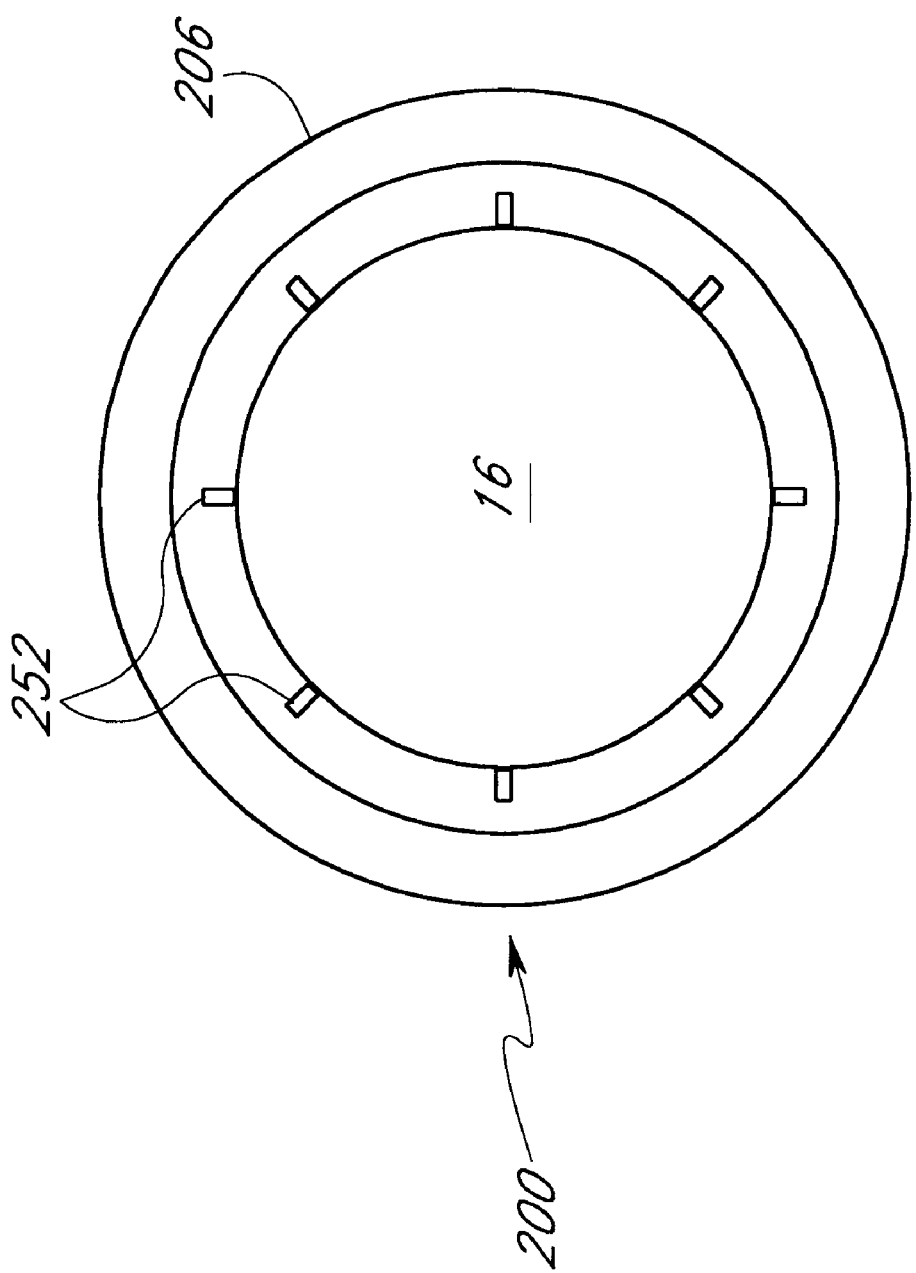
FIG. 8 is a schematic plan view of a wafer centered on a susceptor by a plurality of the locators of FIG. 7B.

The locators 250 and 252 are positioned with their inner edges 260 and 262, respectively, along a circle with a diameter slightly larger than the diameter of the wafer. Preferably, there are between 6 and 10 locators, more preferably between about 7 and 9 locators, and most preferably about 8 locators spaced evenly around the edge of the pocket 202, as shown in FIG. 8.

The substrate support described herein contains features that make improvements over the prior art for many aspects of substrate positioning in substrate processing systems. In particular, the enclosed flow volume in the susceptor pocket under the substrate and the escape area around the periphery of the substrate have been designed to reduce the possibility of substrate slide and stick during drop off and pick up. This ensures that the substrate is positioned near the center of the susceptor pocket during processing. In another embodiment, centering locators around the edge of the susceptor pocket reduce further the possibility of contact between the substrate and the outer edge of the susceptor. These features of the susceptor pocket prevent contact between the edge of the substrate and the cooler outer shoulder of the substrate holder, thereby helping to achieve temperature uniformity and ensuring that the quality of the process result has good repeatability.

It will be appreciated by those skilled in the art that various modifications and changes may be made without departing from the scope of the invention, and all such modifications and changes are intended to fall within the scope of the invention, as defined by the appended claims.

I claim:

1. A substrate holder comprising a concave support surface configured to underlie a supported substrate, the support surface defined by tops of a plurality of protrusions, the protrusions separated by a plurality of crossing grid grooves, the support surface having a concavity, the concavity of the support surface defining a pocket of between about 0.130 mm and 0.500 mm in depth measured from a top surface of a peripheral grid protrusion of the support surface to a central grid protrusion within the support surface.

2. The substrate holder of claim 1, further comprising an annular shoulder surrounding a recess sized to receive the substrate, the recess containing the concave support surface.

3. The substrate holder of claim 2, wherein the recess and the concave support surface are sized to receive a 200-mm substrate and the concavity defines the pocket of between about 0.130 mm and 0.250 mm in depth.

4. The substrate holder of claim 3, wherein the recess and the concave support surface are sized to receive a 200-mm substrate and the concavity defines the pocket of between about 0.170 mm and 0.220 mm in depth.

5. The substrate holder of claim 2, wherein the recess and the concave support surface are sized to receive a 300-mm substrate and the concavity defines the pocket of between about 0.300 mm and 0.500 mm in depth.

6. The substrate holder of claim 5, wherein the recess and the concave support surface are sized to receive a 300-mm substrate and the concavity defines the pocket of between about 0.360 mm and 0.400 mm in depth.

7. The substrate holder of claim 2, wherein an outer circumference of the support surface is spaced below an upper surface of the annular shoulder by an amount between about 0.010 and 0.025 inches.

8. The substrate holder of claim 2, wherein an outer circumference of the support surface is spaced below an upper surface of the annular shoulder by an amount between about 0.015 and 0.020 inches.

9. The substrate holder of claim 2, wherein an annular groove separates the annular shoulder from the support surface.

10. The substrate holder of claim 1, wherein for a flat 200-mm substrate supported upon the holder, a total enclosed flow volume, consisting of a volume between the substrate and the support surface and a volume within the grid grooves in the support surface, is between about $1.3 \times 10^{-5}$ m$^3$ and $4.0 \times 10^{-5}$ m$^3$.

11. The substrate holder of claim 10, wherein an escape area defined as a total cross-sectional area of the grid grooves beneath and around a perimeter of the substrate is between about $2.0 \times 10^{-4}$ m$^2$ and $4.0 \times 10^{-4}$ m$^2$.

12. The substrate holder of claim 11, wherein the escape area is between about $2.5 \times 10^{-4}$ m$^2$ and $3.5 \times 10^{-4}$ m$^2$.

13. The substrate holder of claim 1, wherein for a flat 300-mm substrate supported upon the holder, a total enclosed flow volume, consisting of a volume between the substrate and the support surface and a volume within the grid grooves in the support surface, is between about $3.0 \times 10^{-5}$ m$^3$ and $6.0 \times 10^{-5}$ m$^3$.

14. The substrate holder of claim 9, wherein the total enclosed flow volume is between about $3.5 \times 10^{-5}$ m$^3$ and $4.5 \times 10^{-5}$ m$^3$.

15. The substrate holder of claim 9, wherein an escape area defined as a total cross-sectional area of the grid grooves beneath and around a perimeter of the substrate is between about $3.0 \times 10^{-4}$ m$^2$ and $6.0 \times 10^{-4}$ m$^2$.

16. The substrate holder of claim 15, wherein the escape area is between about $4.0 \times 10^{-4}$ m$^2$ and $5.0 \times 10^{-4}$ m$^2$.

17. The substrate holder of claim 1, wherein for a flat 150-mm substrate supported upon the holder, a total enclosed flow volume, consisting of a volume between the substrate and the support surface and a volume within the grid grooves in the support surface, is between about $7.5 \times 10^{-6}$ m$^3$ and $10.0 \times 10^{-6}$ m$^3$.

18. The substrate holder of claim 17, wherein the total enclosed flow volume is between about $8.0 \times 10^{-6}$ m$^3$ and $9.0 \times 10^{-6}$ m$^3$.

19. The substrate holder of claim 17, wherein an escape area defined as a total cross-sectional area of the grid grooves under a perimeter of the substrate is between about $0.1 \times 10^{-4}$ m$^2$ and $5.0 \times 10^{-4}$ m$^2$.

20. The substrate holder of claim 19, wherein the escape area is between about $2.0 \times 10^{-4}$ m$^2$ and $3.0 \times 10^{-4}$ m$^2$.

21. The substrate holder of claim 1, comprising graphite with a silicon carbide coating.

22. The substrate holder of claim 1, wherein a depth of the grooves from the protrusion tops is between about 0.35 mm and 0.55 mm.

23. The substrate holder of claim 22, wherein the depth of the grooves is between about 0.40 mm and 0.45 mm.

24. The substrate holder of claim 1, wherein a pitch between adjacent similar features on the support surface is between about 1.0 mm and 1.5 mm.

25. The holder of claim 1, having at least one receiving groove on a bottom surface thereof for a plurality of spider arms.

26. The holder of claim 25, wherein the support surface contains no through-holes to the bottom surface.

27. A substrate holder-comprising a concave support surface configured to underlie a supported substrate, the support surface defined by tops of a plurality of protrusions, the protrusions separated by a plurality of crossing grid grooves, the support surface having a concavity, the concavity of the support surface defining a pocket of between about 0.130 mm and 0.500 mm in depth measured from a peripheral grid protrusion of the support surface to a central grid protrusion within the support surface, wherein for a flat 200-mm substrate supported upon the holder, a total enclosed flow volume, consisting of a volume between the substrate and the support surface and a volume within the grid grooves in the support surface, is between about $1.4 \times 10^{-5}$ $m^3$ and $1.6 \times 10^{-5}$ $m^3$.

28. The substrate holder of claim 27, wherein the pitch is between about 1.2 mm and 1.3 mm.

29. A susceptor with a recessed pocket for holding a 150-mm semiconductor wafer in a high temperature reaction chamber, the pocket having a concave and gridded bottom surface with protrusions extending therefrom, wherein a top of a central protrusion of a support surface is lower than a top of a perimeter protrusion of the support surface, comprising a total enclosed flow volume between the wafer and bottom of the gridded surface greater than $7.5 \times 10^{-6}$ $m^3$.

30. A susceptor with a recessed pocket for holding a semiconductor wafer with a diameter greater than or equal to 200 mm in a high temperature reaction chamber, the pocket having a curved surface with concavity and a grid, comprising a total enclosed flow volume between the wafer and bottom of the grid of between about $1.3 \times 10^{-5}$ $m^3$ and $6.0 \times 10^{-5}$ $m^3$.

31. The susceptor of claim 30 wherein the wafer diameter is 200 mm and the total enclosed flow volume is between about $1.3 \times 10^{-5}$ $m^3$ and $4.0 \times 10^{-5}$ $m^3$.

32. The susceptor of claim 30 wherein the wafer diameter is 200 mm and the concavity of the surface is between about 0.130 mm and 0.250 mm.

33. The susceptor of claim 30 wherein the wafer diameter is 300 mm and the total enclosed flow volume is between about $3.0 \times 10^{-5}$ $m^3$ and $6.0 \times 10^{-5}$ $m^3$.

34. The susceptor of claim 30 wherein the wafer diameter is 300 mm and the concavity of the surface is between about 0.300 mm and 0.500 mm.

35. A holder for a generally flat substrate comprising an annular shoulder with a shoulder upper surface surrounding a recess sized larger than the substrate, the recess having a recess upper surface with a curved shape and a grid of grooves extending into the recess upper surface and also comprising a plurality of centering locators arranged along an inside circumference of the annular shoulder to establish a distance between the substrate and the annular shoulder, thereby preventing direct thermal contact between the shoulder and the substrate, each centering locator having an inner edge that is arranged along a circle that defines a space for receiving the substrate.

36. The holder of claim 35, wherein a width of each centering locator along the inner edge is less than about 1.00 mm.

37. The holder of claim 35, wherein outer edges of the centering locators are in contact with the inside circumference of the annular shoulder.

38. The holder of claim 35, wherein there is a space between an outer edge of each centering locator and the inside circumference of the annular shoulder.

39. The holder of claim 38, wherein the outer edge of each centering locator is spaced between about 0.50 mm and 2.00 mm from the inside circumference of the annular shoulder.

40. The holder of claim 39, wherein each centering locator has a centering locator upper surface that is about level with the shoulder upper surface.

41. The holder of claim 39, wherein the recess upper surface along the circle that defines a space for receiving the substrate is positioned below the shoulder upper surface by an amount about equal to a thickness of the substrate.

42. The holder of claim 39, wherein there are between about 6 and 10 centering locators.

43. The holder of claim 39, having about 8 centering locators.

44. The holder of claim 39, wherein each centering locator has a centering locator upper surface with a radial length between about 1.00 mm and 2.00 mm.

45. The holder of claim 39, wherein the substrate is an 200-mm silicon wafer.

46. The holder of claim 39, wherein the substrate is a 300-mm silicon wafer.

* * * * *